United States Patent [19]
Shiomi et al.

[11] Patent Number: 6,007,730
[45] Date of Patent: Dec. 28, 1999

[54] METHOD OF MANUFACTURING DIAMOND HEAT SINK

[75] Inventors: Hiromu Shiomi; Yoshiaki Kumazawa, both of Hyogo, Japan

[73] Assignee: Sumitomo Electric Industries, Ltd., Osaka, Japan

[21] Appl. No.: 09/021,546

[22] Filed: Feb. 10, 1998

[30] Foreign Application Priority Data

Feb. 14, 1997 [JP] Japan ..................................... 9-030102

[51] Int. Cl.⁶ .............................. B44C 1/22; H01L 23/34; H01L 21/3065
[52] U.S. Cl. ................................ 216/17; 216/41; 216/51; 216/56; 216/65; 216/67; 216/81; 257/706; 257/712; 257/930; 438/105; 252/70
[58] Field of Search .................................. 216/17, 41, 51, 216/56, 65, 67, 81; 252/70; 438/105; 257/706, 712, 930

[56] References Cited

U.S. PATENT DOCUMENTS

| | | | |
|---|---|---|---|
| 5,160,405 | 11/1992 | Miyauchi et al. | 156/643 |
| 5,294,381 | 3/1994 | Iguchi et al. | 427/250 |
| 5,334,280 | 8/1994 | Anthony et al. | 216/65 |
| 5,495,126 | 2/1996 | Iguchi et al. | 257/717 |
| 5,500,393 | 3/1996 | Nishibayashi et al. | 437/175 |
| 5,604,037 | 2/1997 | Ting et al. | 428/408 |
| 5,663,595 | 9/1997 | Shiomi et al. | 257/712 |
| 5,874,775 | 2/1999 | Shiomi et al. | 257/712 |

FOREIGN PATENT DOCUMENTS

| | | |
|---|---|---|
| 0 419087 | 3/1991 | European Pat. Off. . |
| 0 442006 | 8/1991 | European Pat. Off. . |
| 0 538798 | 4/1993 | European Pat. Off. . |
| 0 546824 | 6/1993 | European Pat. Off. . |
| 3 257098 | 11/1991 | Japan . |
| 5-114677 | 5/1993 | Japan . |
| 7 040336 | 2/1995 | Japan . |

OTHER PUBLICATIONS

John D. Hunn et al.; Ion beam and laser-assisted micromachining of single-crystal diamond; Solid State Technology, vol. 37, No. 12, Dec. 1994, pp. 57 to 60.

*Primary Examiner*—Helene Klemanski
*Attorney, Agent, or Firm*—W. F. Fasse; W. G. Fasse

[57] ABSTRACT

A diamond polycrystal body having metal films on its upper and lower surfaces is cut in the vertical direction using a laser to form a diamond polycrystal body piece having upper and lower surfaces and a cut surface connecting the upper and lower surfaces. The cut surface may be damaged and include graphite resulting from the laser cutting. To remove the damage and the graphite, the cut surface of the diamond polycrystal body piece is then plasma-treated. Thereby a prescribed degree of electrical insulation between the metallized upper and lower surfaces can be ensured.

16 Claims, 3 Drawing Sheets

6,007,730

METHOD OF MANUFACTURING DIAMOND HEAT SINK

BACKGROUND OF THE INVENTION

1. Field of the Invention

The present invention relates generally to methods of manufacturing a diamond heat sink, and more particularly, to a method of manufacturing a diamond heat sink produced by metallizing a diamond surface formed by means of vapor phase synthesization.

2. Description of the Background Art

In association with developments in today's high information-intensive society, the performance of semiconductor devices such as a semiconductor laser diode and an IMPATT diode used for transmitting information has been remarkably improved. In order to further improve the performance of these semiconductor devices, thermal energy generated by these devices should be radiated or dissipated to restrict the temperature increase of the devices. The heat sink is used for such heat radiation. The material known as the best for the heat sink was type II a natural diamond.

Meanwhile, heat sinks have been produced using synthetic diamond, and such heat sinks exhibit high thermal conductivity comparable to type II a natural diamond, with a smaller variation in quality, and therefore have stable heat radiation performance, contributing to improvements in the performance and reliability of various semiconductor devices and prolonging the life of the devices.

The present invention relates to a method of manufacturing a diamond heat sink produced by metallizing a surface of such synthetic diamond, in other words diamond synthesized by means of vapor phase synthesization.

Five specific examples of a conventional method of manufacturing a diamond heat sink will be now described. In a first conventional example, a diamond polycrystal body is cut into pieces of a prescribed shape by a diamond saw. The diamond pieces cut into a prescribed shape are arranged close to each other and metallized. Metallizing the upper and lower surfaces completes the diamond heat sink.

In a second conventional example, a diamond polycrystal body is cut into pieces of a prescribed shape by a diamond saw. After metallizing the entire surface, end faces of the pieces are ground using a grind stone to leave the metal film only at the upper and lower surfaces and the diamond heat sink is completed.

In a third example, a diamond polycrystal body having its surface metallized is cut into pieces of a prescribed shape by a diamond saw to complete a diamond heat sink.

In a fourth example, as disclosed by Japanese Patent Laying-Open No. 5-114677, and corresponding U.S. Pat. No. 5,294,381 after metallizing the surface of a diamond polycrystal body, grooves are made in the diamond using a laser, followed by mechanical separation to complete a diamond heat sink.

In a fifth conventional example, diamond is cut into pieces of a prescribed shape by a laser. The conductive portion of each end face is removed by means of an oxidation treatment, and then the pieces are arranged close to each other for metallization. Thus metallizing the upper and lower surfaces completes a diamond heat sink.

Diamond heat sinks have been conventionally manufactured as described above.

In a cutting method using a diamond saw, however, a diamond polycrystal body cannot be highly precisely cut or a large margin is necessary for cutting.

A margin for grinding should be further taken into account for grinding. A method using a laser provides precise cutting, but a conductive layer (graphite layer) is sometimes formed at a cut surface due to graphitization and other damages caused by the laser. An oxidation treatment to remove the conductive layer is therefore necessary. In that case, after a diamond polycrystal body is cut into pieces of a prescribed shape, metallization should be performed. However, after cutting a diamond polycrystal body into pieces of a prescribed shape, metallization with a complicated pattern using photolithography or the like cannot be performed.

Furthermore, in the above-described method of making grooves using a laser after metallization, a chip portion is formed at an end surface in the final mechanical separation process.

SUMMARY OF THE INVENTION

The present invention is directed to achieving solutions to the above-described problems, and it is an object of the invention to provide an improved method of manufacturing a diamond heat sink which permits precise and efficient processing.

In a method of manufacturing a diamond heat sink according to the present invention, a diamond polycrystal body having metal films on its upper and lower surfaces is prepared. The diamond polycrystal body is cut in the vertical direction to form diamond polycrystal body pieces having upper and lower surfaces and a cut surface connecting the upper and lower surfaces. The resulting cut surface of the diamond polycrystal body piece is subjected to plasma treatment.

Since the cut surface of the diamond polycrystal body piece is plasma-treated, damages on the cut surface are removed, and a diamond heat sink having a prescribed insulation property is obtained.

According to a preferred embodiment of the invention, a diamond polycrystal body is cut using a YAG laser or an excimer laser, and therefore precise and efficient processing may be achieved.

According to the preferred embodiment of the invention, the above-described plasma treatment is performed using oxygen, halogen, a halogen compound or an inert gas. Thus, diamond having a clean surface results.

According to the preferred embodiment of the invention, the above-described plasma processing is performed while protecting the surface or surfaces other than the cut surface using a resin film softer than the metal film.

According to another preferred embodiment of the invention, $CF_4$ is used as a halogen compound by the $CF_4/O_2$ percentage is optimized. If $CF_4/O_2$ exceeds 70%, the effect of damaging a metallized layer exceeds the effect of removing a damage layer on diamond, $CF_4/O_2$ is desirably not more than 70%. In order to minimize damages caused to the metal film, the percentage is preferably not more than 50%.

Damaged layers of diamond may be removed using only oxygen, but the percentage of $CF_4/O_2$ is desirably not less than 5%. Thus, the diamond surface after removal of the damaged layers is flat.

Damages are removed such that the electrical resistance between the upper and lower surfaces of the diamond heat sink is not less than $1 \times 10^6 \, \Omega$. This value is an insulation resistance value generally necessary for a semiconductor laser, and the performance of a semiconductor laser will be reduced if the resistance is less than this value.

Since a diamond polycrystal body having a thermal conductivity of at least 5 w/cmK is used, the resultant heat sink can achieve sufficient thermal performance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
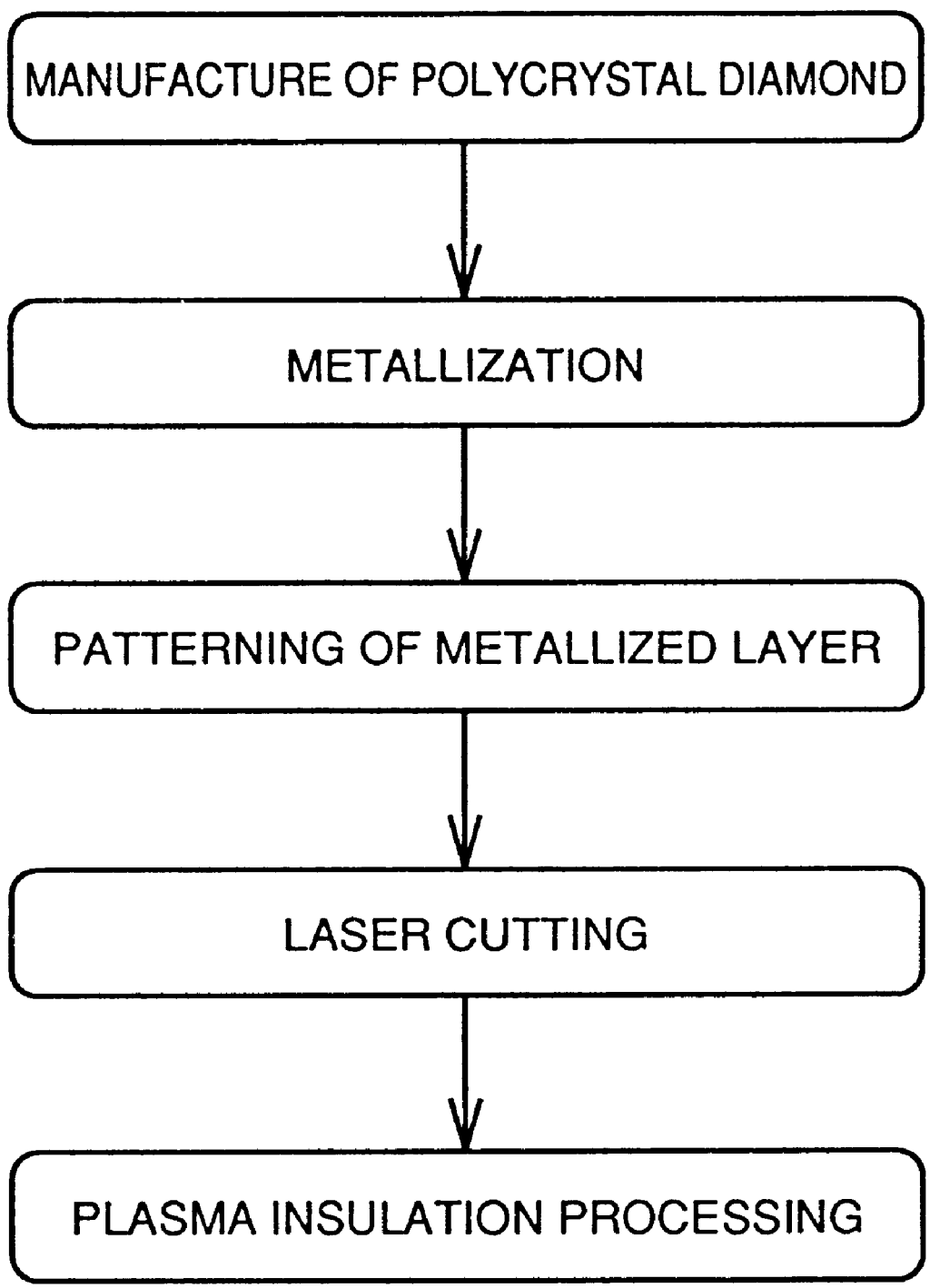
FIG. 1 is a chart showing a process of manufacturing a diamond heat sink.

FIG. 1 is a process chart schematically showing a method of manufacturing a diamond heat sink according to one embodiment of the invention. A polycrystal diamond body is manufactured. The polycrystal diamond body is metallized, whereby metal films (also referred to as metallized layers) are formed on the upper and lower surfaces of the diamond body. The metal films are patterned. The patterning of the metal films will be later described. The diamond polycrystal body is cut in the vertical direction into diamond polycrystal pieces respectively having upper and lower surfaces and a cut surface connecting the upper and lower surfaces. Next, the cut surfaces of the diamond polycrystal pieces are plasma-treated for achieving proper electrical insulation between the metallized layers.

Embodiments of the invention will be now described in conjunction with the accompanying drawings.

First Embodiment

A diamond polycrystal body was synthesized by means of filament CVD. The diamond polycrystal body was formed to have a size of 0.3 mm in thickness and 25.4 mm in both longitudinal and transverse directions. The polycrystal body was finished into a thickness of 0.25 mm by grinding processing.

Metal films were formed both on the upper and lower surfaces of the resulting ground diamond polycrystal body in the order of Ti, Pt, Au and a gold-tin alloy by means of sputtering. The Ti has a film thickness of 600 Å, Pt 800 Å, Au 10000 Å and the gold-tin alloy 30000 Å.

The upper surface of the uppermost metal film was coated with a photoresist by means of spin-coating, a pattern corresponding to a device to be packaged was transferred onto the photoresist by means of photolithography, and a metal film pattern was formed by means of ion beam etching through the patterned photoresist.

The diamond polycrystal body having the metal film pattern thereon was cut into a lattice, using a YAG laser to form a plurality of diamond polycrystal body heat sinks (also referred to as polycrystal body pieces). The resulting diamond polycrystal body heat sinks were damaged by the YAG laser, and thus a graphite layer was formed on the diamond cut surface, which attained conductivity so that the resistance between the upper and lower surfaces was not more than $10^2$ Ω.

Figure 2:
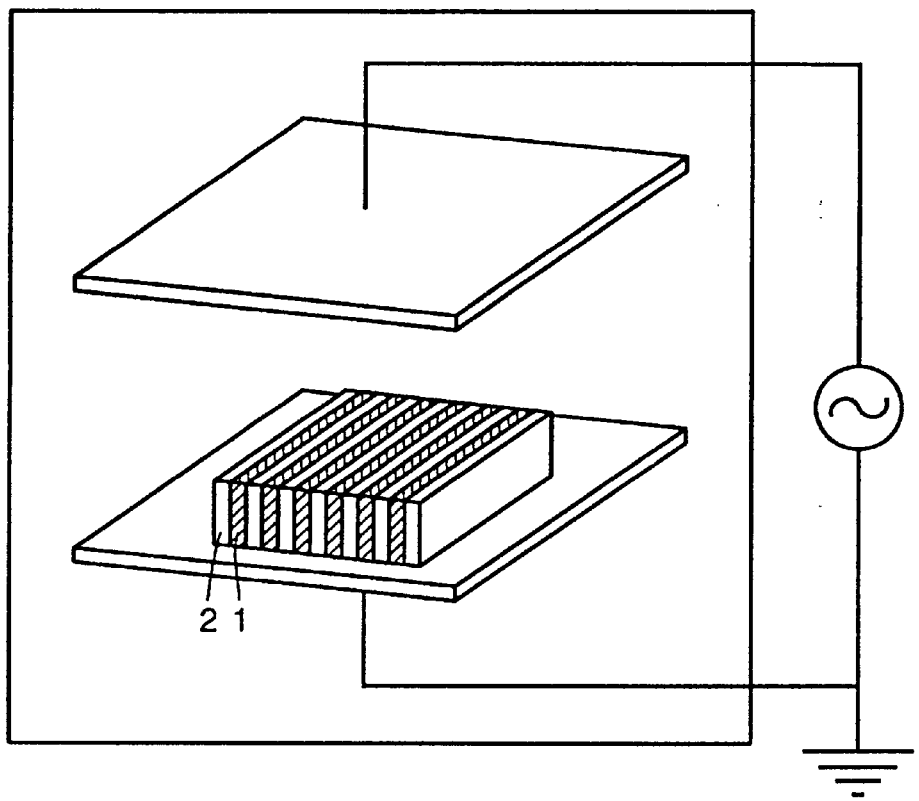
FIG. 2 is a view showing a main step in a method of manufacturing a diamond heat sink according to a first embodiment.

Referring to FIG. 2, a plurality of diamond heat sinks 1 and a plurality of buffer members 2 of Teflon (trademark) resin were placed upon or stacked with each other and introduced into a reactive ion etching device (RIE device) so that the cut surface of the heat sinks was exposed to plasma. By placing buffer member 2 and heat sinks 1 upon each other as shown, only the cut surface of the heat sinks were subjected to plasma and the surfaces of the metal films were not exposed to plasma. Reactive ion etching with the plasma was conducted with 50 sccm oxygen, and 20 sccm $CF_4$ at an RF power of 300 W and under the total pressure of 50 mTorr for 1 minute.

As a result, a damage layer of the cut surface was removed and the resistance between the upper and lower surfaces was brought to $5 \times 10^9$ Ω, in other words a prescribed insulation was secured.

Second Embodiment

A diamond polycrystal body was synthesized by microwave plasma CVD. The diamond polycrystal body was formed into a size of 0.8 mm in thickness and 30 mmφ. The diamond polycrystal body was then finished into a thickness of 0.6 mm by grinding processing. On the upper and lower surfaces of the ground diamond polycrystal body, Ti, Pt, Au and a gold-tin alloy were deposited in this order by means of vapor deposition to form metal films. The thicknesses of Ti, Pt, Au, and the gold-tin alloy were 500 Å, 400 Å, 10000 Å, and 50000 Å, respectively.

As in the first embodiment, a metal film pattern was formed on the upper surface by means of photolithography. The diamond polycrystal body having the patterned metal film was cut into 6 mm×2 mm pieces by a YAG laser. The polycrystal body pieces had damages caused by the YAG laser, so that their cut surfaces attained conductivity, whereby the resistance of the upper and lower surfaces of the diamond polycrystal body pieces was not more than $10^3$ Ω.

Figure 3A:
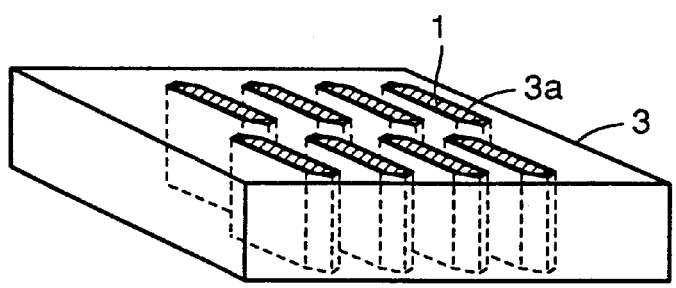
FIGS. 3A and 3B are views showing a first step in a main part of a method of manufacturing a diamond heat sink according to a second embodiment of the invention.
Figure 3B:
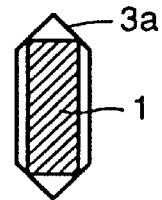

Referring to FIG. 3A, a jig 3 having an opening 3a to hold diamond polycrystal body piece 1 upright is prepared. Diamond polycrystal piece 1 is held upright in jig 3, at which time, polycrystal body piece 1 is fixed in jig 3 such that the cut surface of polycrystal body piece 1 is exposed. FIG. 3B is a plan view showing how diamond polycrystal body piece 1 is set in the opening 3a of jig 3.

Figure 4A:
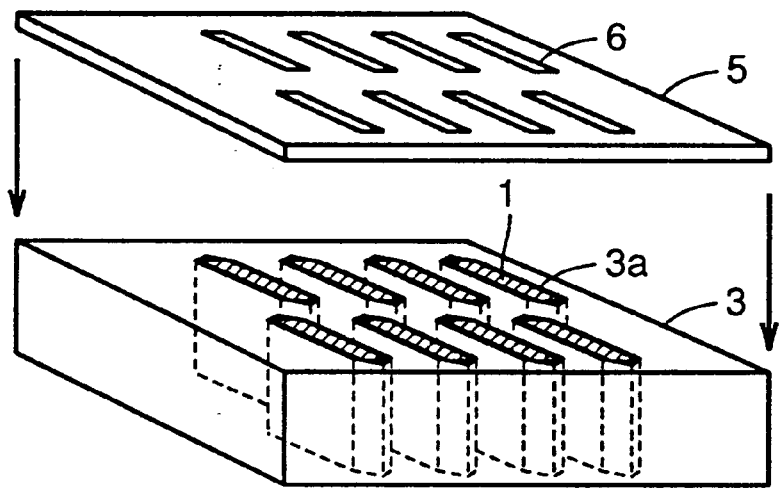
FIGS. 4A and 4B are views showing a second step in the main part of the method of manufacturing a diamond heat sink according to the second embodiment.
Figure 4B:
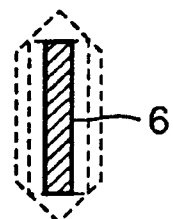

Referring to FIG. 4A, a metal film mask (as thick as 50 μm) 5 having a slit 6 for exposing the cut surface of diamond polycrystal body piece 1 is placed on jig 3. Metal mask 5 is provided to prevent oxygen ions from coming into contact with the gold-tin alloy surface provided on diamond polycrystal body piece 1. FIG. 4B is a partial plan view showing how metal mask 5 is placed on jig 3.

Figure 5:
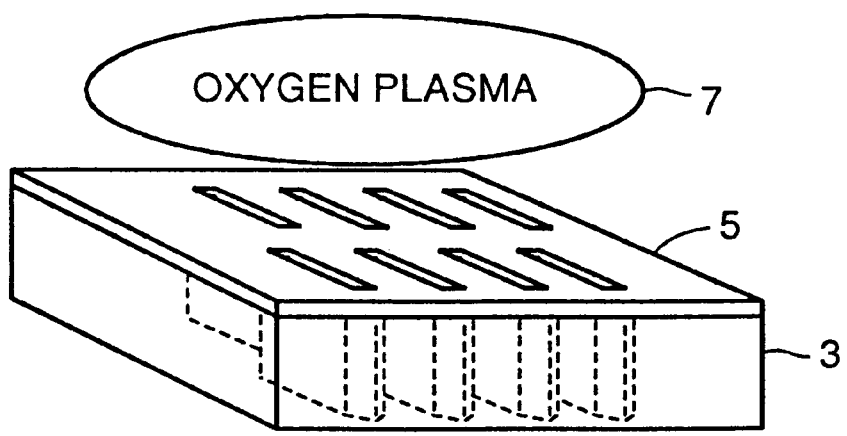
FIG. 5 is a view showing a third step in the main part of the method of manufacturing a diamond heat sink according to the second embodiment.

Referring to FIG. 5, jig 3 having metal mask 5 fixed thereon is introduced into the RIE device for RIE processing. The etching was conducted at the total pressure of 10 mTorr, and with RF power of 300 W and 50 sccm $O_2$ for 30 minutes.

Referring to FIG. 5, a graphite component of diamond polycrystal body piece 1 formed by damages caused by the YAG laser cutting was etched away by oxygen ion plasma 7, and the resistance of the upper and lower surfaces was brought to $4 \times 10^9$ Ω, in other words prescribed insulation was secured.

As in the foregoing, according to the present invention, a cut surface of a diamond polycrystal body piece is plasma-treated, and therefore a graphite component formed on the cut surface is etched away, so that a prescribed degree of insulation is advantageously secured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a diamond heat sink, comprising the steps of:

preparing a diamond polycrystal body having metal films formed on upper and lower body surfaces thereof;

cutting said diamond polycrystal body, thereby forming at least one diamond polycrystal body piece having upper and lower piece surfaces with portions of said metal films thereon and a cut surface connecting said upper and lower piece surfaces; and after said cutting is completed, plasma-treating said cut surface of said diamond polycrystal body piece with a plasma.

2. The method of manufacturing a diamond heat sink as recited in claim 1, wherein said cutting of said diamond polycrystal body is performed using a YAG laser or an excimer laser.

3. The method of manufacturing a diamond heat sink as recited in claim 1, wherein said plasma-treating comprises forming said plasma of a plasma material gas comprising oxygen, halogen, a halogen compound or an inert gas.

4. The method of manufacturing a diamond heat sink as recited in claim 1, further comprising masking a surface of said diamond polycrystal body piece other than said cut surface with a resin which is softer than said metal film, prior to carrying out said plasma-treating of said cut surface.

5. The method of manufacturing a diamond heat sink as recited in claim 1, further comprising arranging a metal mask to mask said upper and lower piece surfaces prior to said plasma-treating of said cut surface so that said plasma is prevented from coming into contact with said upper and lower piece surfaces of said diamond polycrystal body piece.

6. The method of manufacturing a diamond heat sink as recited in claim 1, comprising continuing said plasma-treating until an electrical resistance between said upper and lower piece surfaces becomes at least $1 \times 10^6$ $\Omega$.

7. The method of manufacturing a diamond heat sink as recited in claim 1, wherein said diamond polycrystal body has a thermal conductivity of at least 5 w/cmK.

8. The method of manufacturing a diamond heat sink as recited in claim 3, wherein said plasma material gas comprises said oxygen and said halogen compound, said halogen compound is $CF_4$, and a ratio $CF_4/O_2$ is in the range from greater than 0% to 70%.

9. The method of manufacturing a diamond heat sink as recited in claim 8, wherein said ratio $CF_4/O_2$ is in the range from 5% to 50%.

10. The method of manufacturing a diamond heat sink as recited in claim 3, wherein said plasma material gas consists essentially of said oxygen.

11. The method of manufacturing a diamond heat sink as recited in claim 1, further comprising, before said step of cutting, a step of patterning at least a first one of said metal films comprising applying a photoresist layer onto said first metal film, patterning said photoresist layer by photolithography, and then etching a pattern into said first metal film through said patterned photoresist layer by ion beam etching.

12. The method of manufacturing a diamond heat sink as recited in claim 1, wherein said plasma is an RF plasma, and wherein said plasma-treating comprises generating said RF plasma by applying RF power to a plasma material gas so as to ionize said gas and form said RF plasma, and exposing said cut surface to said RF plasma.

13. The method of manufacturing a diamond heat sink as recited in claim 12, wherein said generating of said RF plasma is carried out under a reduced pressure of not more than 50 mTorr.

14. The method of manufacturing a diamond heat sink as recited in claim 1, wherein said plasma-treating comprises a reactive ion etching of said cut surface using said plasma.

15. The method of manufacturing a diamond heat sink as recited in claim 1, further comprising, after said cutting and before said plasma-treating, an additional step of stacking a plurality of said at least one diamond polycrystal body piece respectively alternatingly with buffer members of polymer resin so that said cut surface of each said diamond polycrystal body piece is exposed and said portions of said metal films provided on said upper and lower piece surfaces of each said diamond polycrystal body piece are covered by said buffer members, and wherein said plasma-treating is carried out to contact said plasma onto said exposed cut surfaces.

16. The method of manufacturing a diamond heat sink as recited in claim 1, further comprising, after said cutting and before said plasma-treating, an additional step of arranging and fixing a plurality of said at least one diamond polycrystal body piece in respective receiving holes provided in a jig and then arranging a metal film mask having a plurality of slit openings over said jig so that said slit openings expose said cut surfaces of said diamond polycrystal body pieces and said jig covers said portions of said metal films provided on said upper and lower piece surfaces, and wherein said plasma-treating is carried out to contact said plasma onto said exposed cut surfaces.

* * * * *